US007859268B2

(12) United States Patent
Okuzono et al.

(10) Patent No.: US 7,859,268 B2
(45) Date of Patent: Dec. 28, 2010

(54) METHOD OF TESTING DRIVING CIRCUIT AND DRIVING CIRCUIT FOR DISPLAY DEVICE

(75) Inventors: Noboru Okuzono, Kanagawa (JP); Takashi Morigami, Shiga (JP); Tsukasa Yasuda, Shiga (JP)

(73) Assignee: Renesas Electronics Corporation, Kanagawa (JP)

( * ) Notice: Subject to any disclaimer, the term of this patent is extended or adjusted under 35 U.S.C. 154(b) by 1155 days.

(21) Appl. No.: 11/512,351

(22) Filed: Aug. 30, 2006

(65) Prior Publication Data

US 2007/0067693 A1 Mar. 22, 2007

(30) Foreign Application Priority Data

Sep. 2, 2005 (JP) ............................ 2005-254483

(51) Int. Cl.
*G01R 31/00* (2006.01)
*G09G 3/00* (2006.01)

(52) U.S. Cl. ....................... 324/527; 324/770; 345/204; 345/904

(58) Field of Classification Search ................ 324/527, 324/403; 345/904
See application file for complete search history.

(56) References Cited

U.S. PATENT DOCUMENTS

| | | | | |
|---|---|---|---|---|
| 6,972,755 | B2 * | 12/2005 | Plangger | 345/204 |
| 7,268,763 | B2 * | 9/2007 | Fukuda et al. | 345/98 |
| 7,436,381 | B2 * | 10/2008 | Kim et al. | 345/87 |
| 2003/0132906 | A1 * | 7/2003 | Tanaka et al. | 345/89 |

FOREIGN PATENT DOCUMENTS

JP 2002-304164 A 10/2002

* cited by examiner

*Primary Examiner*—Timothy J Dole
*Assistant Examiner*—John Zhu
(74) *Attorney, Agent, or Firm*—Sughrue Mion, PLLC

(57) ABSTRACT

A test signal is supplied to a test switch provided between a D/A converter for selecting and outputting a gray scale voltage of the driving circuit and an amplifier for amplifying and supplying an output voltage at the D/A converter to set a test mode, and an output voltage of the D/A converter is directly measured by a measuring device through the test switch to measure an ON resistance of a gray scale voltage selection circuit of the D/A converter.

5 Claims, 10 Drawing Sheets

| | | DC POWER SOURCE RELAY | | | | | | |
|---|---|---|---|---|---|---|---|---|
| | GRAY SCALE | V0 | V1 | V2 | V3 | V4 | V5 | V6 |
| V0 | 0 | ON | OFF | OFF | OFF | OFF | OFF | OFF |
| V1 | 1 | OFF | ON | OFF | OFF | OFF | OFF | OFF |
| | 2 | | | | | | | |
| | : | | | | | | | |
| | 8 | | | | | | | |
| | 9 | OFF | OFF | ON | OFF | OFF | OFF | OFF |
| | : | | | | | | | |
| | 15 | | | | | | | |
| V2 | 16 | | | | | | | |
| | 17 | | | | | | | |
| | : | | | | | | | |
| | 23 | | | | | | | |
| | 24 | OFF | OFF | OFF | ON | OFF | OFF | OFF |
| | : | | | | | | | |
| | 31 | | | | | | | |
| V3 | 32 | | | | | | | |
| | 33 | | | | | | | |
| | : | | | | | | | |
| | 40 | | | | | | | |
| | 41 | OFF | OFF | OFF | OFF | ON | OFF | OFF |
| | : | | | | | | | |
| | 47 | | | | | | | |
| V4 | 48 | | | | | | | |
| | 49 | | | | | | | |
| | : | | | | | | | |
| | 55 | | | | | | | |
| | 56 | OFF | OFF | OFF | OFF | OFF | ON | OFF |
| | : | | | | | | | |
| | 61 | | | | | | | |
| V5 | 62 | | | | | | | |
| V6 | 63 | OFF | OFF | OFF | OFF | OFF | OFF | ON |

Fig. 5

METHOD OF TESTING DRIVING CIRCUIT AND DRIVING CIRCUIT FOR DISPLAY DEVICE

BACKGROUND OF THE INVENTION

1. Field of the Invention

The present invention relates to a driving circuit for a display device which can be tested with high accuracy and a method of testing the display device.

2. Description of Related Art

In general, display drivers for driving a display device such as a liquid crystal display includes a shift register, a data register, a data latch, a level shifter, a digital-analog converter (D/A converter), and an output amplifier. The shift register sequentially shifts gray scale data of input digital image signals of each pixel. The data register sequentially holds the gray scale data corresponding to one scanning line. The data latch latches the gray scale data corresponding to one scanning line. The level shifter changes a voltage level of the gray scale data. The D/A converter performs D/A conversion on the gray scale data to generate an analog signal corresponding to the gray scale data. The analog signal is appropriately amplified by the output amplifier and then output.

Incidentally, the display driver has many D/A converters for driving each of pixels corresponding to one scanning line, so it is very complicated to test the driver for testing whether or not the converters normally operate. To that end, a method of testing a driver circuit that aims at testing the circuit for leak current from an analog voltage lead and output lead as short a period as possible over a wide range is disclosed in, for example, Japanese Unexamined Patent Application Publication No. 2002-304164 (hereinafter referred to as "Related Art").

FIG. 9 shows the driver circuit described in the Related Art. As shown in FIG. 9, a driver circuit 101 includes a voltage generator 107, leads $M_i$ connected to the voltage generator 107, a first switching device 102 connected with all the leads $M_i$, and N output stages $A_N$ connected with all the leads $M_i$. The N output stages $A_N$ each include a multiplexing device (hereinafter referred to as "selection circuit") 104 connected with all the leads $M_i$, an amplifier 105 connected with the selection circuit 104, and a second switching device 103 connected between the selection circuit 104 and the amplifier 105 and connecting an output of the selection circuit 104 to the ground GND. The selection circuit 104 receives a digital signal $E_N$ to selectively output a signal of any one of the leads $M_i$.

The way to test the leakage between adjacent ones of the leads $M_i$ in the driver circuit is as below. That is, M bus lines are charged up to the maximum potential, and the bus line $M_i$ is disconnected from the voltage generator 107 by way of the first switching device 102 to bring all the leads $M_i$ into a floating state. Then, one of the second switching devices 103 is selected to connect one of the output stages $A_N$ with one GND terminal. Then, a digital signal $E_i$ is input to the output stage connected with the ground GND to switch any one of the leads $M_i$ to GND. An output voltage of the other output stages is checked to thereby detect the leakage between the leads $M_i$ and $M_{i-1}$, or between the leads $M_i$ and $M_{i+1}$. It is thus possible to test the driver using the digital signal, so a test period can be reduced.

Incidentally, upon testing the driver for the function besides the test for the leakage between the leads, it is determine whether or not the driver is accepted through a speed test (through rate test) of a selection circuit (ROM unit) provided at a stage previous to the amplifier 105. In the speed test, the output voltage level is sampled over a predetermined period to check whether or not the through rate is a preset period or more. As a result, abnormalities in the ON resistance of the selection circuit and in the driving power of the output amplifier can be detected. In this case, in general, the selection circuit 104 selects a predetermined voltage from voltages generated by the voltage generator 107 to check the output voltage of the amplifier (AMP) 105.

However, in the test method described in the Related Art, the first switching device 102 is first connected with the voltage generator 107 and charged up to a predetermined potential, and then the second switching device 103 is turned off. Next, a target one of the leads $M_i$ is selected based on the digital signal $E_i$ and connected with GND. Finally, a potential of each of the output stages $A_N$ that output potentials of the other leads is checked. These series of steps should be repeated as many times as the number of leads $M_i$, so it takes much time to execute the test.

Further, in the above speed test of the selection circuit, a delay time (ROM speed) at the time of selecting the output voltage at the selection circuit 104 is generated by way of the amplifier 105, so the determination thereof is difficult. That is, in the speed test, characteristics of the ON resistance in the selection circuit 104 and characteristics of the amplifier 105 influence each other, and thus are hardly distinguished from each other. FIG. 10 is a schematic diagram showing an output voltage of the amplifier in the conventional driver circuit. As shown in FIG. 10, it is necessary to execute sampling during a transitional period for measuring the through rate. Hence, if the original output voltage $V_{OUT1}$ is $V_{OUT2}$, it is impossible to determine whether the problem is an insufficient ability of the AMP (amplifier) or a high ON resistance of the selection circuit 104.

That is, since the output voltage of the selection circuit 104 cannot be directly measured, it is difficult to set a determination criterion at sampling points. In addition, if a current leaks around the input side of the amplifier 105 of the selection circuit 104, and a voltage applied to the transistor drops, so the leakage of the current cannot be detected. Further, the problem is caused by the fact that the ON resistance in the selection circuit 104 is converted into the through rate of the output and a voltage level thereof is detected.

As mentioned above, although the driving circuit needs a variety of functional tests, in the test method described in, for example, the Related Art, only the leakage between leads can be tested. If a variety of tests such as the speed test of the selection circuit can be accurately and quickly executed in addition to a particular test of the leakage between leads in the driver circuit, a display device of, for example, high performance and low cost can be more easily provided.

SUMMARY OF THE INVENTION

According to an aspect of the present invention, a method of testing a driving circuit for a display device, includes: supplying a test signal to a test switch provided between a D/A converter for selecting and outputting a gray scale voltage of the driving circuit and an amplifier for amplifying an output voltage of the D/A converter to set a test mode; and connecting the D/A converter with an output terminal of the driving circuit through the test switch to conduct a test on the D/A converter.

According to the present invention, the D/A converter is connected with an output terminal and measured for an output voltage not through an amplifier but through a test switch, thereby making it possible to execute a test based on a current or voltage value that does not vary depending on the amplifier and to measure an ON resistance of a selection circuit in the D/A converter with high accuracy.

According to the present invention, it is possible to provide a universal driving circuit for a display device on which various types of tests can be conducted by directly checking an output voltage of the D/A converter, and a method of testing the driving circuit.

BRIEF DESCRIPTION OF THE DRAWINGS

The above and other objects, advantages and features of the present invention will be more apparent from the following description taken in conjunction with the accompanying drawings, in which:

FIG. 5 shows an example of how to execute on/off control of a relay switch that supplies DC power (voltages V0 to V7) upon testing the driver according to the embodiment of the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, an embodiment of the present invention is described in detail with reference to the accompanying drawings. This embodiment is attained by applying the present invention to a driver circuit as a driver for driving a display device, which measures an ON resistance of a gray scale voltage selection circuit that decodes input signals and selects a gray scale voltage to thereby determine the quality of the gray scale voltage selection circuit (abnormality detection) with accuracy.

More specifically, in order to measure the ON resistance independently of an AMP or the like which is connected with an output of the gray scale voltage selection circuit, a switching circuit is provided between the gray scale voltage selection circuit and the AMP. The AMP or the like is disconnected from the gray scale voltage selection circuit using the switching circuit, thereby making it possible to accurately measure the ON resistance of the gray scale voltage selection circuit.

Figure 1:
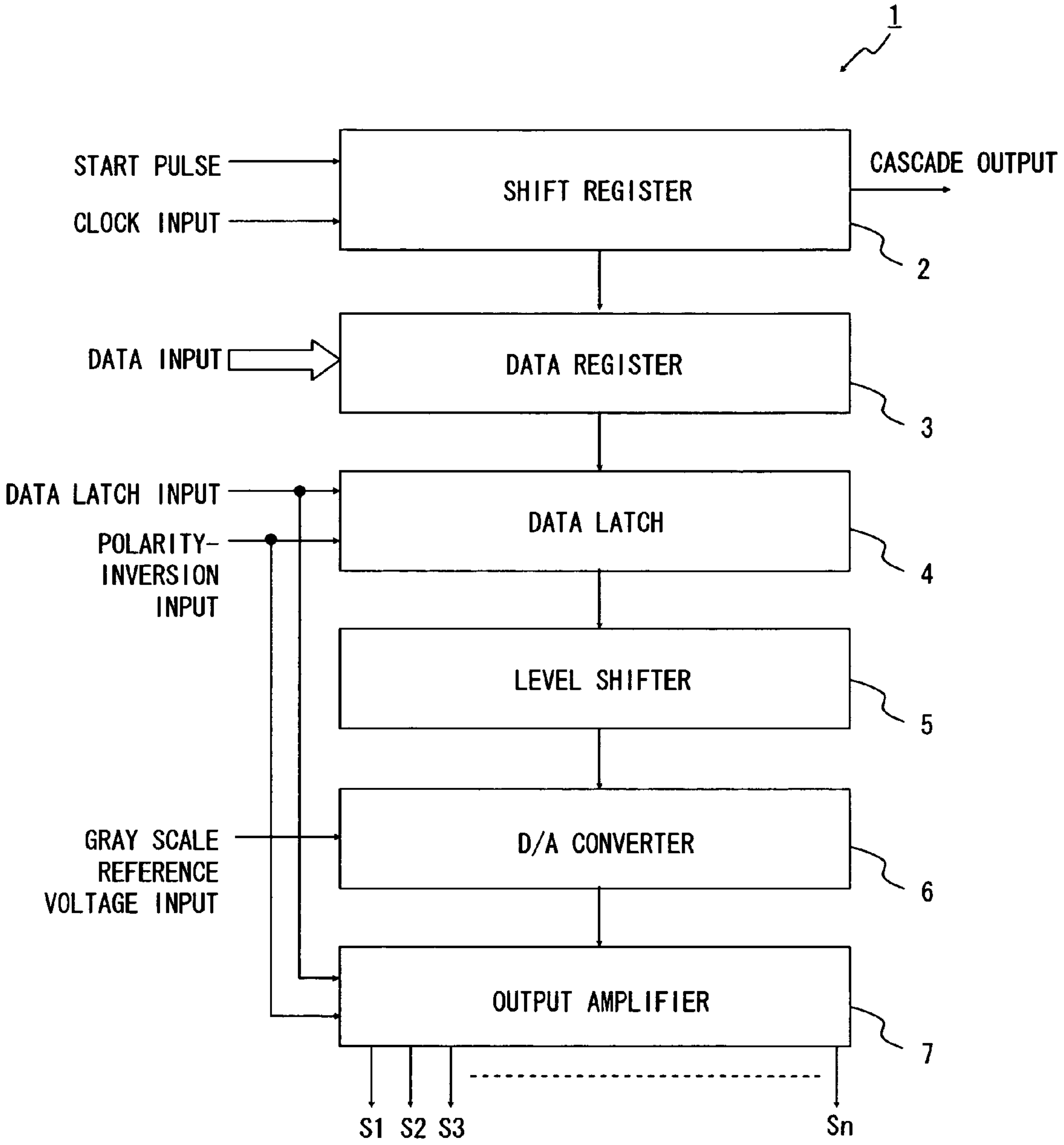
FIG. 1 is a block diagram showing a general driver circuit.
Figure 2:
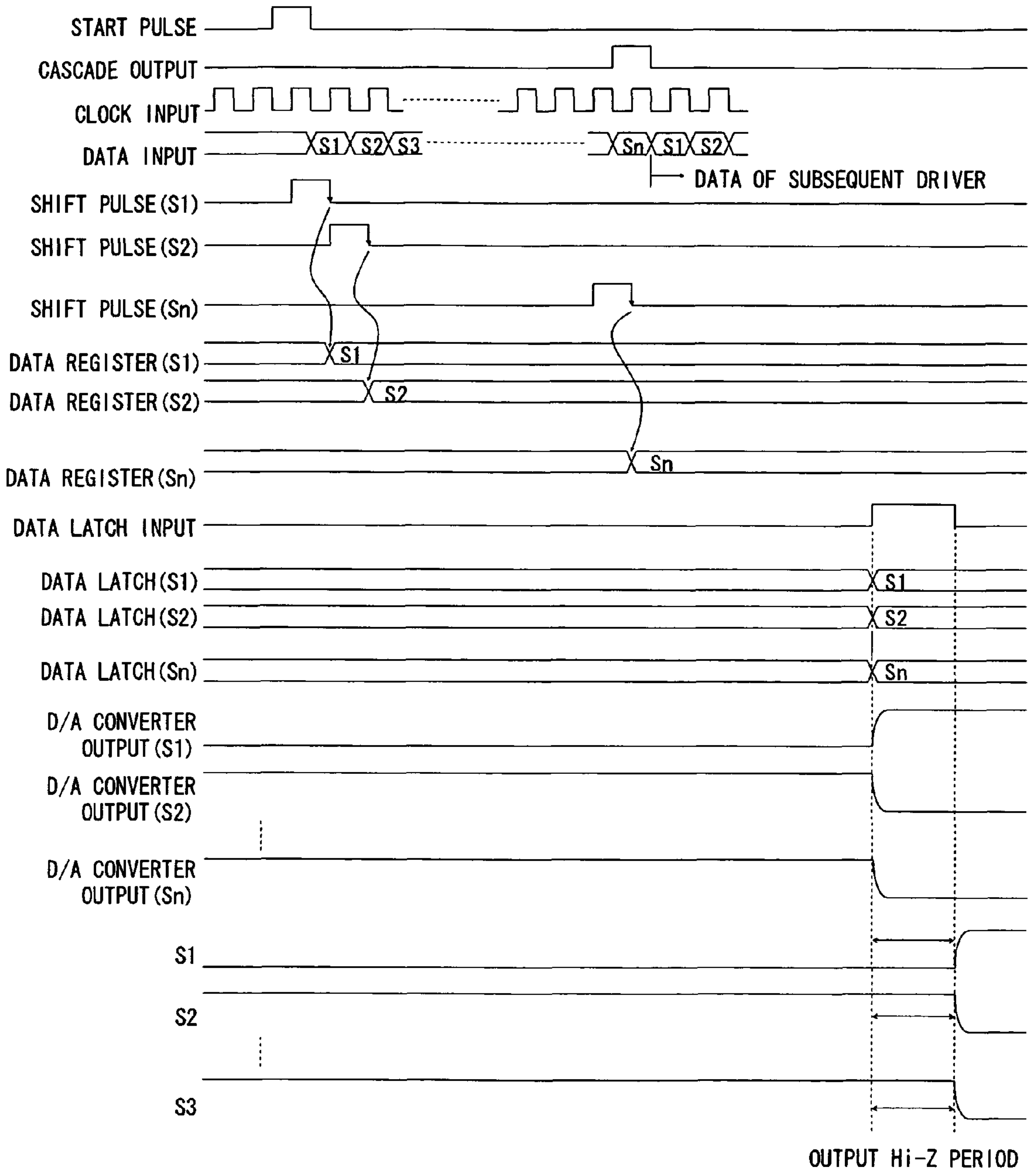
FIG. 2 is a timing chart of each signal input to the driver circuit of FIG. 1.

Prior to description of a driver circuit and a method of testing the driver circuit according to this embodiment, a driver circuit of a display device is explained. FIG. 1 is a block diagram showing a general driver circuit, and FIG. 2 is a timing chart of each signal input to the driver circuit of FIG. 1.

As shown in FIG. 1, the driver circuit 1 outputs signals S1 to Sn, that is, data to n pixels, and includes a shift register 2, a data register 3, a data latch 4, a level shifter 5, a D/A converter 6 and an output amplifier unit 7. An output voltage of the shift register 2 in the driver circuit 1 is applied to a subsequent cascaded driver circuit, and plural driver circuits 1 are cascaded to constitute a data driving circuit (source driver). The shift register 2 includes registers of n stages, and is applied with shift start pulses and clocks to subsequently shift the start pulses in sync with the clocks to obtain shift pulse signals (S1) to (Sn) as shown in FIG. 2.

The data register 3 includes registers of n stages, and digital image signals (hereinafter referred to as "data") are supplied to the registers in parallel. The registers sequentially hold the data on the falling edge of, for example, shift pulse signals (S1) to (Sn) supplied by the shift register 2.

After the completion of the input of the data to all the registers of the data register 3, the data latch 4 receives data latch signals to latch all the data stored in the registers of the data register 3. A voltage level of the data latched with the data latch 4 is appropriately shifted by means of the level shifter 5.

The D/A converter 6 decodes the data the voltage level of which has been shifted to output a gray scale voltage. The converter includes a gray scale voltage generating unit and a gray scale voltage selection circuit as explained below. A gray scale reference voltage is applied to the gray scale voltage generating unit, and the gray scale voltage selection circuit selectively outputs a voltage of 64 gray scales, for example. The output amplifier unit 7 amplifies an output voltage of the D/A converter 6 and outputs the amplified one as output signals S1 to Sn. The data latch signals and polarity inversion signals supplied to the data latch 4 are also supplied to the output amplifier unit 7, and a signal of a polarity corresponding to the polarity inversion signal is selected and output in sync with the data latch signal.

The output amplifier unit 7 includes an amplifier unit that amplifies a signal in accordance with the polarity, and a switch (hereinafter referred to as "off switch") that controls on/off states of the output of the amplifier unit. As shown in FIG. 2, the off switch turns off the output in accordance with a polarity of the amplifier during a period from the rising edge to the falling edge of the data latch signal as an output high impedance period. This period is a transitional period of the D/A converter 6. In the transitional period until when a potential is determined, the off switch (TOFFSW) can be turned off to attain the high impedance (Hi-Z) state.

At the time of detecting an abnormality of the D/A converter in such a driver circuit, a test signal is supplied for causing the D/A converter 6 to select a gray scale, and an output voltage of the output amplifier unit 7 is measured. However, in this case, the output voltage of the D/A converter 6 cannot be directly measured, and the test result is obtained only through the output amplifier unit 7. Hence, the circuit cannot be tested with accuracy depending on the performance of the amplifier as described above. In this embodiment, the test result is obtained not through the output amplifier unit 7, making it possible to accurately detect an abnormality of the D/A converter.

Figure 3A:
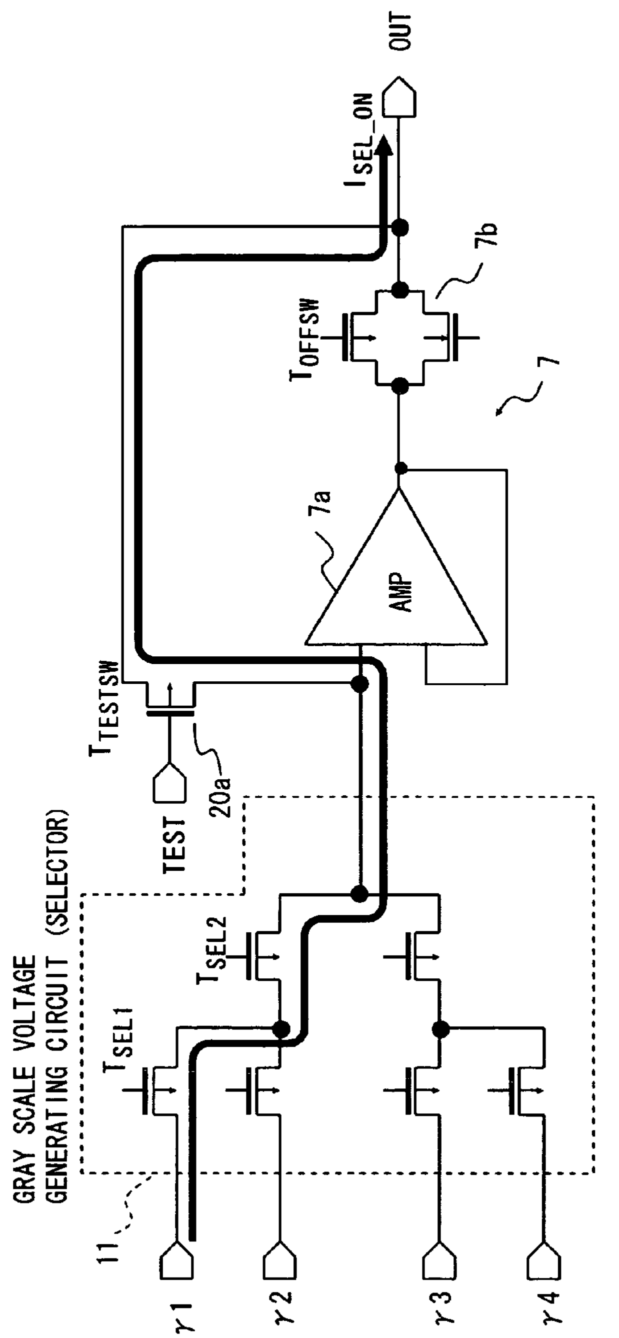
FIGS. 3A and 3B show a circuit from a D/A converter of a driver circuit according to an embodiment of the present invention to an output terminal.
Figure 3B:
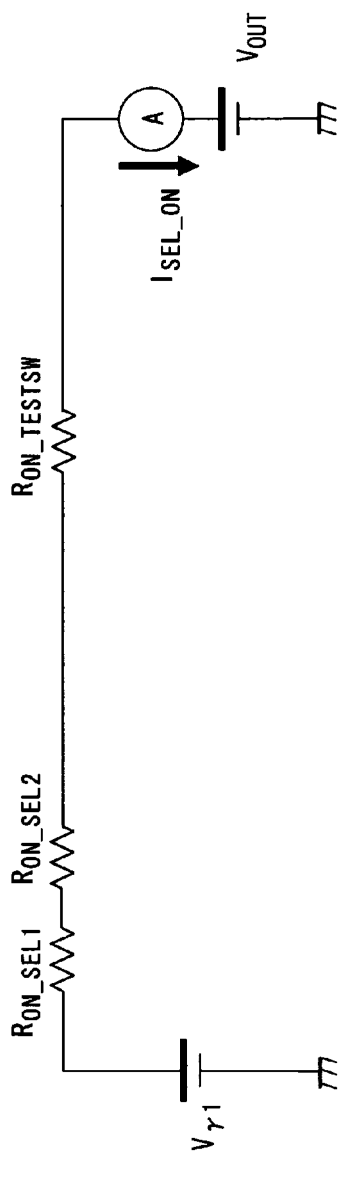

FIGS. 3A and 3B show the circuit from the D/A converter of the driver circuit of this embodiment to an output terminal. To avoid an influence of the output amplifier unit, as shown in FIG. 3A, an input of the output amplifier unit 7 connected with the gray scale voltage selection circuit 11 of the D/A converter and the output OUT of the output amplifier unit 7 are bypassed through a test switch ($T_{TESTSW}$) 20*a* as a MOS transistor, for example. The test switch 20*a* has a control terminal (TEST terminal), and can control the continuity (on/off states). The test switch 20*a* is turned ON to directly connect the input of the output amplifier unit 7 to the output OUT, and the output voltage of the gray scale voltage selection circuit 11 can be directly measured.

The D/A converter includes the gray scale voltage generating unit that generates, for example, gray scale voltages γ1 to γ4, and the gray scale voltage selection circuit 11 that selectively outputs the gray scale voltages γ1 to γ4. The gray scale voltage selection circuit 11 includes plural switches (transistors) for selecting a desired gray scale voltage in accordance with an input signal. The quality of the D/A converter can be determined by accurately measuring the ON resistance thereof. The output amplifier unit 7 includes an AMP 7*a* and an off switch ($T_{OFFSW}$) 7*b* that executes on/off control of the output of the AMP 7*a*. As described above, the off switch 7*b* brings an output signal of the AMP 7*a* into a high impedance state in a normal operational mode until an output voltage of the gray scale voltage selection circuit 11 is stabilized.

For example, if an ON resistance is measured when transistors of switches $T_{SEL1}$ and $T_{SEL2}$ are turned on and a selector selects the gray scale voltage γ1, the test signal TEST is input to the test switch 20*a*, and a node between the gray scale voltage selection circuit 11 and the AMP 7*a* is connected with the output terminal OUT through the test switch 20*a*. As a result, the test switch 20*a* is turned ON, and the off switch 7*b* is turned OFF (output Hi-Z). FIG. 3B shows an equivalent circuit in this case. Provided that a relation between the gray scale voltage γ1 and a voltage applied to the output VOUT is $V_{\gamma1}>V_{OUT}$, and the input of the other gray scale voltages (γ2 to γ4) is made open. In this case, the ON resistance of the gray scale voltage selection circuit 11 can be derived from the following expression.

$$I_{SEL\_ON}=(V_{OUT}-V_{\gamma1})/(R_{ON\_SEL1}+R_{ON\_SEL2}+R_{ON\_TESTSW})$$

$I_{SEL\_ON}$ represents a measurement current, and $R_{ON\_SEL1}$, $R_{ON\_SEL2}$, and $R_{ON\_TESTSW}$ each represent an ON resistance of the switching transistors $T_{SEL1}$ and $T_{SEL2}$, and the test switch 20*a*. In this case, the ON resistance of the switching transistor used in the gray scale voltage selection circuit 11 is several hundreds of kΩ in the case of a Pch transistor. In contrast, the ON resistance of the test switch 20*a* is as small as several tens of Ω and thus hardly influences the measurement precision. Further, a path from the input of the AMP 7*a* to the off switch 7*b* is short-circuited, so the output amplifier unit 7 does not influence the measurement result. Hence, the ON resistance of the gray scale voltage selection circuit 11 can be accurately measured. Incidentally, the test may be executed such that a test signal is supplied to the AMP 7*a* and the output signal is brought into a high impedance state without using or providing the off switch 7*b*.

Further, a power source potential VDD is applied to the output OUT of the output amplifier unit 7 as a first voltage different from the voltage γ1 as a second voltage. Thus, a difference between the output voltage of the gray scale voltage selection circuit 11 and the voltage γ1 is set. The test switch 20*a* is turned on in the test mode, and the output of the gray scale voltage selection circuit 11 is set to the power source potential VDD. Similar to the above, when the switches $T_{SEL1}$ and $T_{SEL2}$ are turned on to select the gray scale voltage γ1, since $V_\gamma$<VDD, a current $I_{SEL\_ON}$ flows toward a power source side of the gray scale voltage γ1. The current is measured to measure the ON resistance of the gray scale voltage selection circuit 11 without the influence of the output amplifier unit 7. Further, the ON resistance of the test switch 20*a* is much smaller than the ON resistance of the switching transistors that compose the gray scale voltage selection circuit 11, and thus does not influence the measurement precision.

The D/A converter 6 includes the gray scale voltage selection circuit 11 and the gray scale voltage generating unit 12. In this embodiment, a gray scale voltage of 64 gray scales is generated and selectively output. In this case, for example, the gray scale voltage generating unit 12 includes 63 resistors R0 to R62. The gray scale voltage of 64 gray scales is generated to divide a DC power supplied by the measurement circuit 30A through the resistive division. In this embodiment, 8 DC power sources $\mathbf{31}_1$ to $\mathbf{31}_8$($\mathbf{31}_k$) for supplying the DC power (voltages V0 to V7) and relay switches $\mathbf{32}_1$ to $\mathbf{32}_8$ ($\mathbf{32}_k$) for connecting the DC power sources $\mathbf{31}_k$ with the gray scale voltage generating unit 12 are provided. A predetermined DC power (voltages V0 to V7) can be supplied to the gray scale voltage generating unit 12 by appropriately turning on/off the relay switches $\mathbf{32}_k$. The gray scale voltage selection circuit 11 includes 64 terminals GMA0 to GMA63. Each end of resistors R0 to R62 of the gray scale voltage generating unit 12 is connected with the terminals GMA0 to GMA63 to select and output any one of gray scale voltages $V_0$ to $V_{63}$ ($V_n$) of 64 gray scales based on input data supplied from the level shifter 5. The output is connected with the measuring device 30C through the test switch 20 as described above to thereby measure the ON resistance of the transistors that compose the gray scale voltage selection circuit 11 of the D/A converter 6.

Further, the shift register 2, the data register 3, the data latch 4, and the level shifter 5 are connected with a measurement circuit 30B. The measurement circuit 30B is a pattern generator, which generates and applies start pulses and clocks supplied to the shift register 2, data supplied to the data register 3, data latch signals and polarity inversion signals supplied to the data latch. Further, the circuit generates a test signal to supply the test signal to the test switch 20.

Further, an output of the output amplifier unit 7 is connected with the measurement circuit 30C. When the test switch 20 is turned on in response to a test signal, the input and the output of the output amplifier unit 7 are connected. Then, the output of the gray scale voltage selection circuit 11 is connected with the measurement circuit 30C not through the output amplifier unit 7 but through the test switch 20. The measurement circuit 30C is a DC test unit, and includes DC relay switches 33*a* and 33*b*, a voltage source/current measurement circuit (VSIM) 34, and a current source/voltage measurement circuit (ISVM) 35. The DC relay switch 33*a* is used to connect an output corresponding to a predetermined output terminal with the measurement circuit 30C. Further, the DC relay switch 33*b* switches the voltage source/current measurement circuit 34 and the current source/voltage measurement circuit 35. Thus, a voltage may be generated to measure a current or a current may be generated to measure a voltage.

Figure 4:
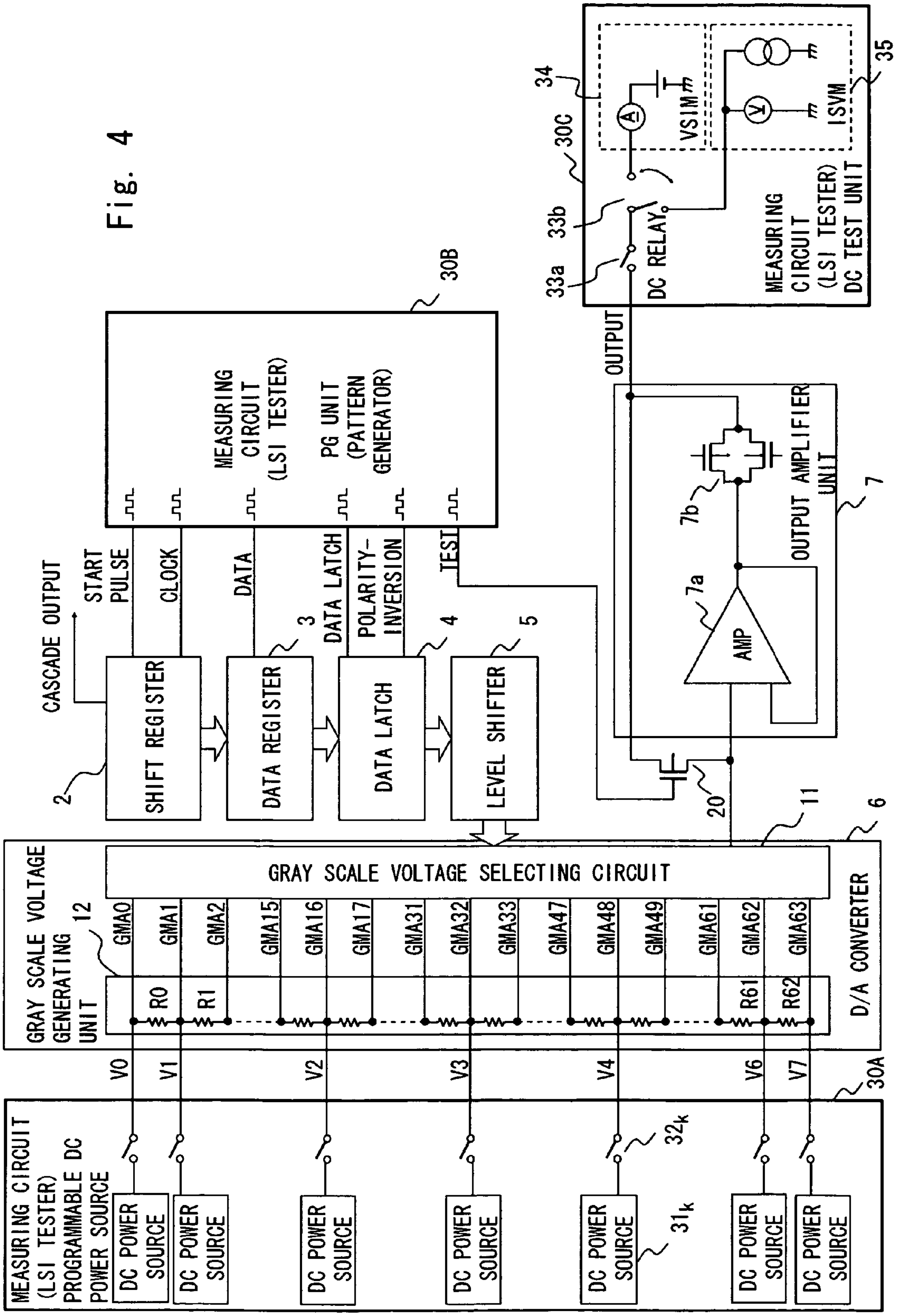
FIG. 4 shows a specific example of a tester for a driver according to the embodiment of the present invention.

The D/A converter or a method of testing the gray scale voltage selection circuit based on the above concept is described in more detail. FIG. 4 shows a tester for the driver of this embodiment. As shown in FIG. 4, the D/A converter 6 is connected with a measurement circuit (LSI tester) 30A. The measurement circuit 30A is a programmable DC power source. In this embodiment, 8 DC power sources $\mathbf{31}_1$ to $\mathbf{31}_8$ ($31_k$) are provided, and 8 DC voltages can be supplied.

LSI tester includes measurement circuits 30*a*, 30*b*, and 30*c*. The measurement circuit 30A is a programmable DC power source. The measurement circuit 30B is a pattern generator, which generates and applies start pulses and clocks supplied to the shift register 2, data supplied to the data register 3, data latch signals and polarity inversion signals supplied to the data latch. Further, the measurement circuit 30B generates a test signal to supply the test signal to the test switch 20. The measurement circuit 30C is a DC test unit, and includes DC relay switches 33*a* and 33*b*, a voltage source/current measurement circuit (VSIM) 34, and a current source/voltage measurement circuit (ISVM) 35. The DC relay switch 33*a* is used to connect an output corresponding to a predetermined output terminal with the measurement circuit 30C. Further, the DC relay switch 33*b* switches the voltage source/current measurement circuit 34 and the current source/voltage measurement circuit 35. Thus, a voltage may be generated to measure a current or a current may be generated to measure a voltage in the measurement circuit 30C.

Figure 6:
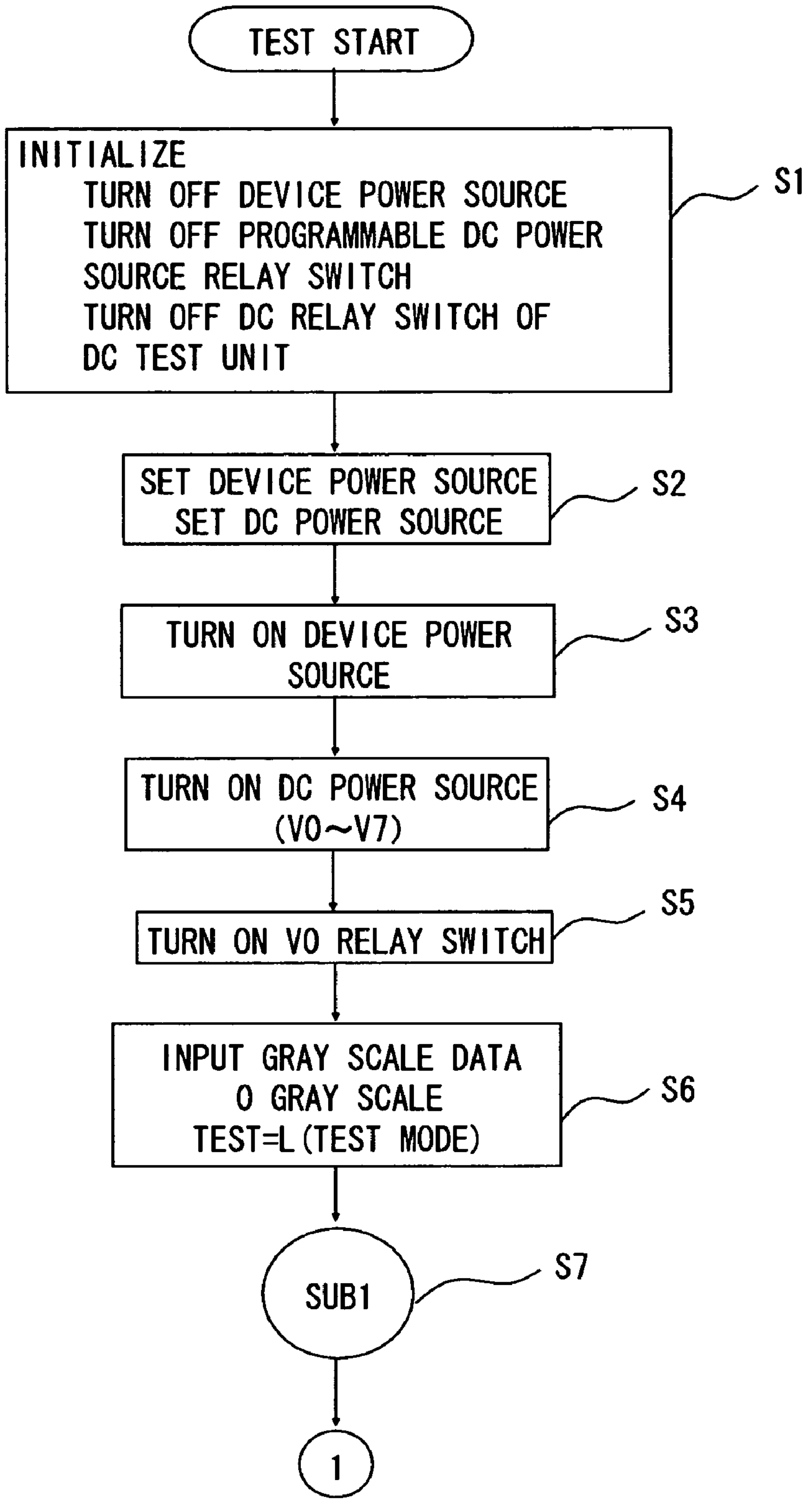
FIG. 6 is a flowchart of a testing method for checking whether or not an abnormality is detected in an ON resistance of a gray scale voltage selection circuit based on the on/off control of the DC power source relay switch of FIG. 5.
Figure 7:
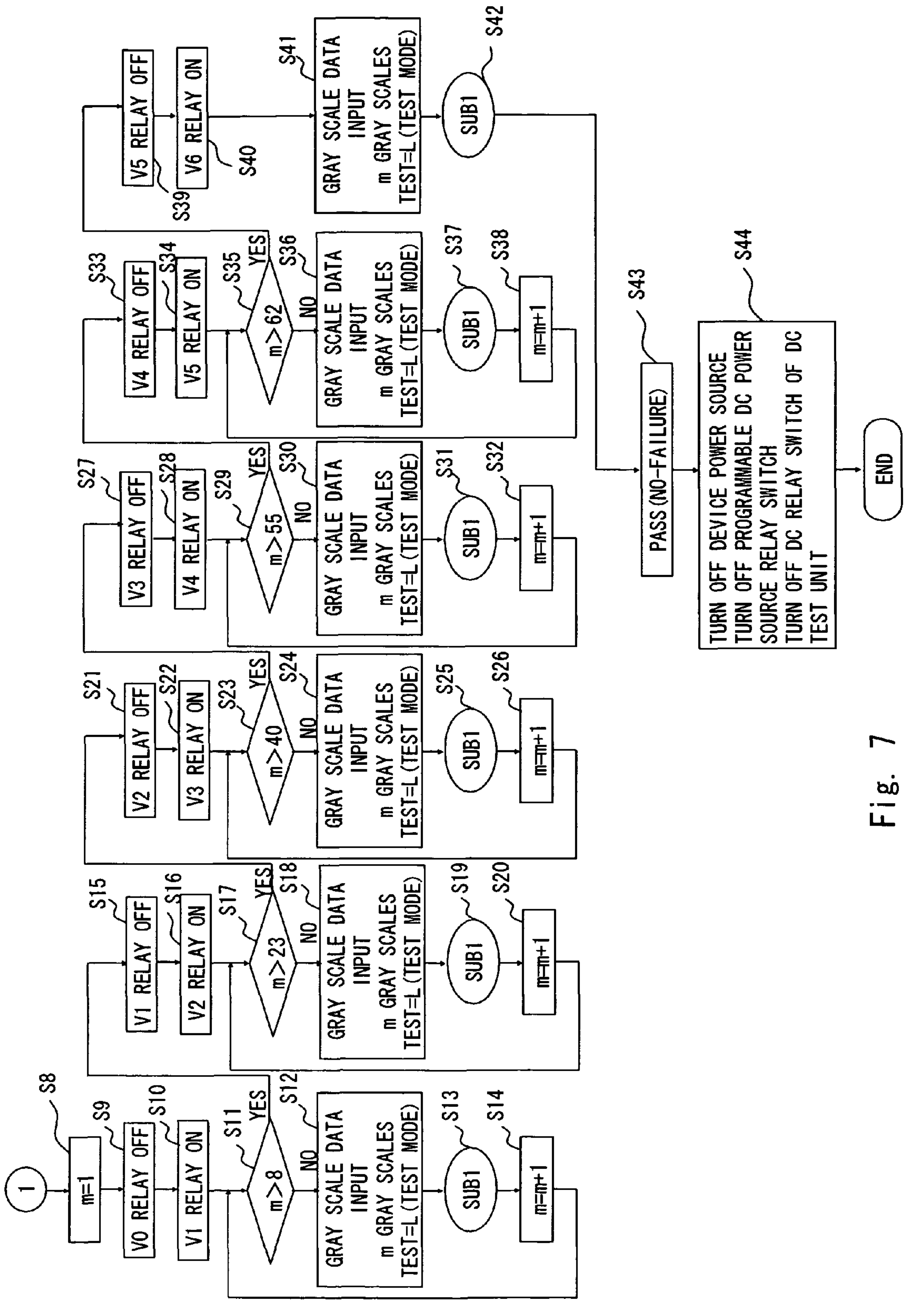
FIG. 7 is another flowchart of a testing method for checking whether or not an abnormality is detected in the ON resistance of the gray scale voltage selection circuit.
Figure 8:
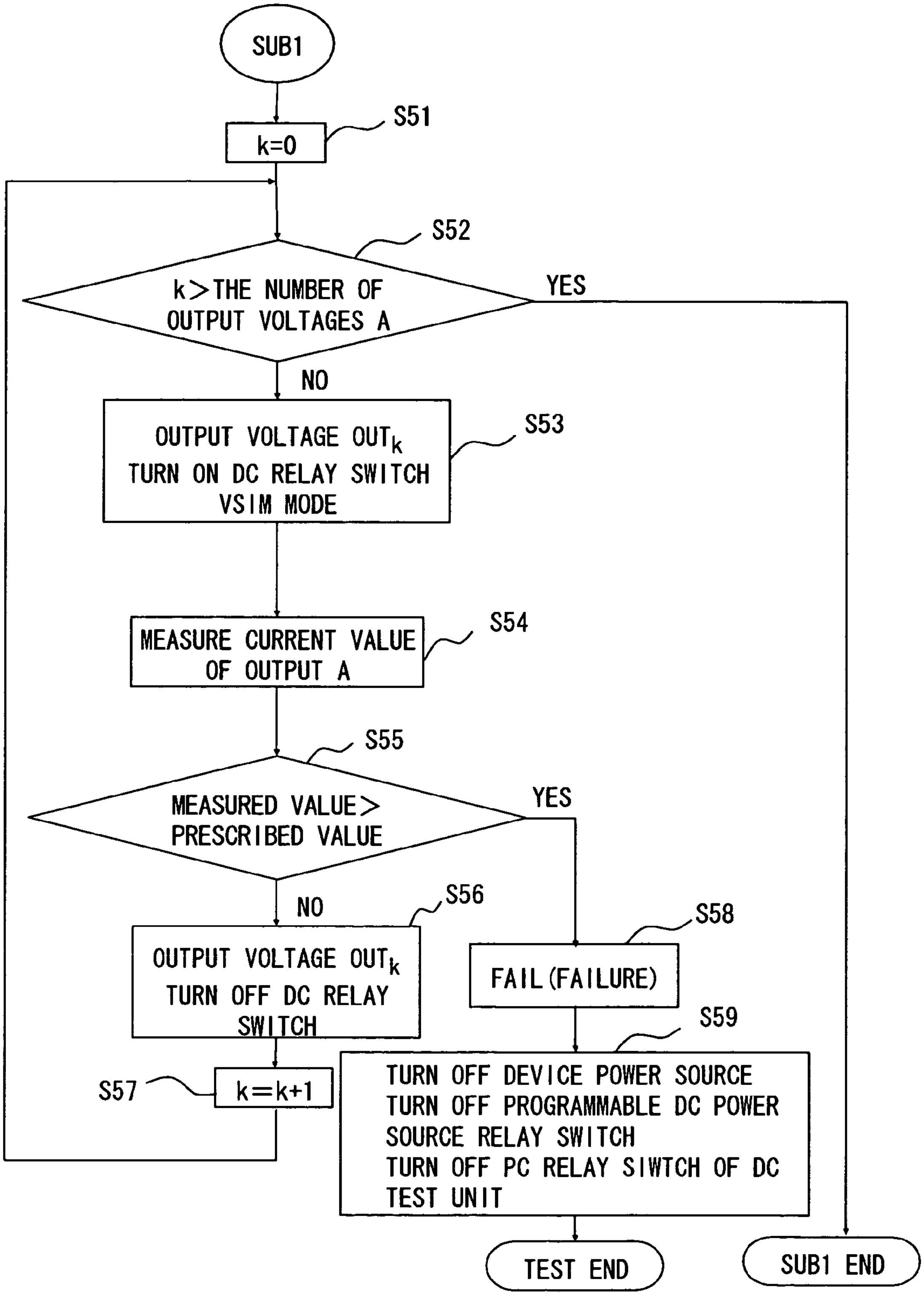
FIG. 8 is a flowchart of a failure/no-failure test on a given gray scale voltage based on output voltages at each output terminal.
Figure 9:
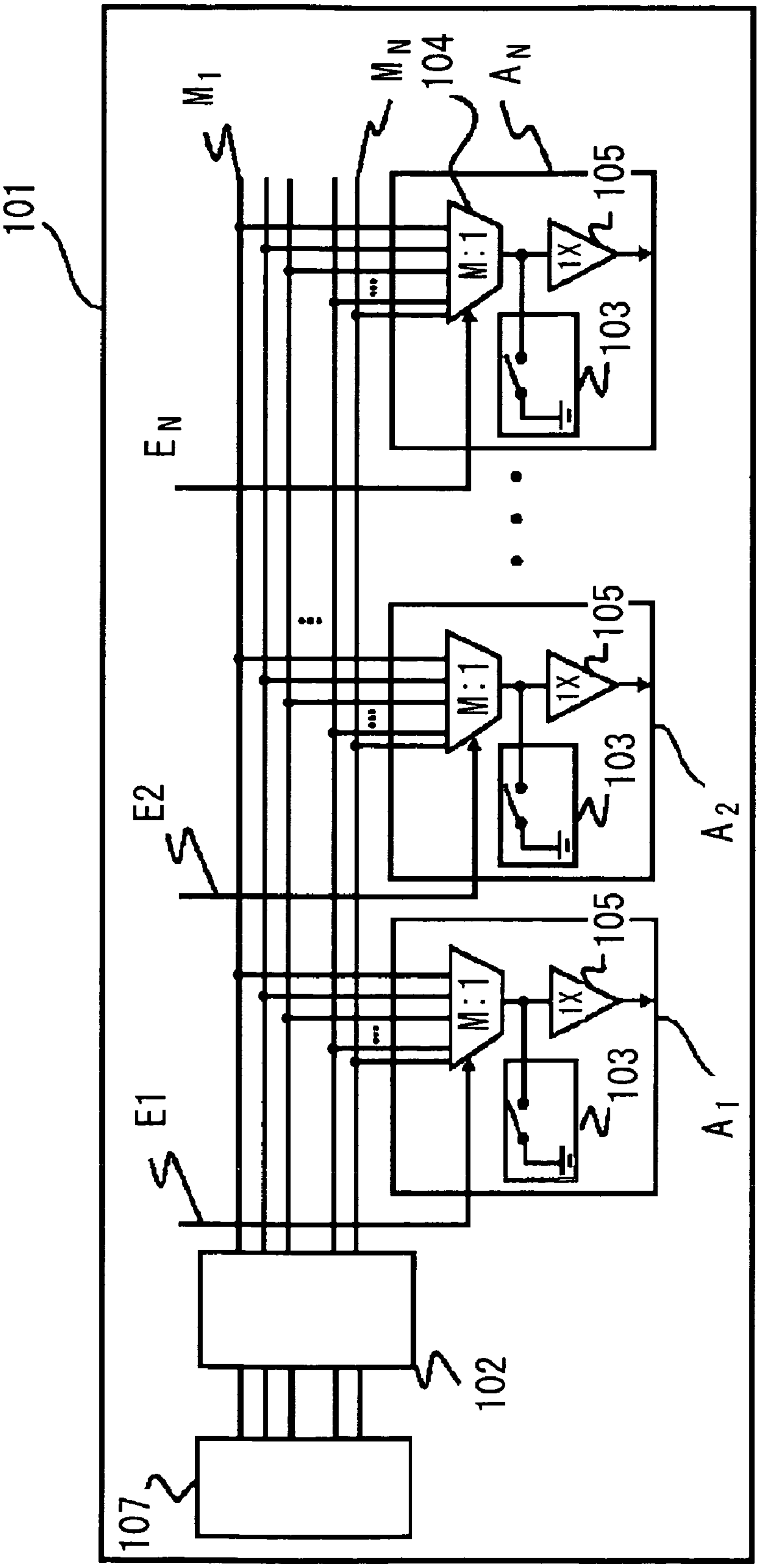
RELATED ART Fig. 9
FIG. 9 shows a driver circuit of the Related Art.
Figure 10:
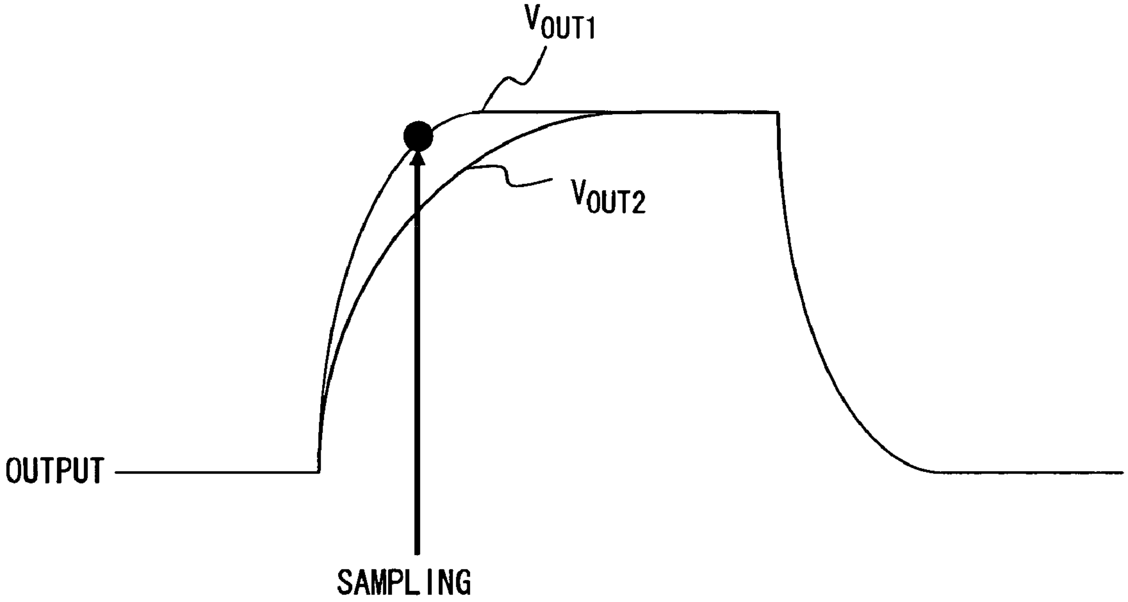
RELATED ART Fig. 10
FIG. 10 is a schematic diagram showing an output of an amplifier of a conventional driver circuit.

Next, a method of testing the thus-configured test circuit is described. The test is executed such that the input data is generated by the measurement circuit (pattern generator) 30B, the gray scale voltage selection circuit 11 selects a predetermined gray scale voltage, and the voltage is measured by the measurement circuit (DC test unit) 30C. At this time, the DC power source relay switch $32_k$ of the measurement circuit (programmable DC power source) 30A is appropriately turned on/off to supply the DC power (voltages V0 to V7) to the gray scale voltage generating unit 12. FIG. 5 shows an example of how the relay switches $32_1$, to $32_8$ that supplies the DC power (voltages V0 to V7) are turned on/off. Further, FIGS. 6 and 7 are flowcharts of a test method that detects an abnormality of an ON resistance of the gray scale voltage selection circuit 11 based on the on/off control of the DC power source relay switches $32_k$ of FIG. 5 by use of the above method. In addition, FIG. 8 is a flowchart of a failure/no-failure test in the case where the gray scale voltages (the number of gray scales M=0 to m) are output for each of output terminals k (the number of output terminals k=1 to A).

Incidentally, in this embodiment, an ON resistance of the gray scale voltage selection circuit 11 is measured. However, this test may be executed after the test of another unit of the driver or the other operational tests. According to the test of this embodiment of this embodiment, as shown in FIG. 6, a driver and a measurement circuit are first initialized (step S1). Upon the initialization, a device power source for supplying power to the driver is turned off, the programmable DC power source relay switches $32_k$ are turned off, and the DC relay switches 33*a* and 33*b* are turned off.

Next, the device power source and the DC power source are set (step S2). First, the device power source is turned on (step S3), and the DC power sources $31_k$ are turned on (step S4). Next, a V0 relay switch is turned on (step S5). Then, the measurement circuit 30B inputs the gray scale data for selecting 0-gray-scale voltage $V_0$ and a test mode is set using the test signal TEST (step S6). For example, if the test switch 20 is composed of a Pch transistor, the test signal is set to L level to turn on the test switch 20.

Next, the gray scale voltage $V_0$ is output from each output terminal (step S7). Incidentally, the processing of step S7 is described below. Upon the completion of the processing of step S7, as shown in FIG. 7, the number of gray scales m is set to 1 (step S8). Then, in accordance with the diagram of FIG. 5, V0 to V7 relay switches $32_k$ are turned on/off. That is, in the case of testing the gray scale voltages $V_1$ to $V_8$ (m=1 to 8), for example, the V0 relay switch $32_1$ is turned off (step S9), and the V1 relay switch $32_2$ are turned on (step S11). Then, an operation of inputting the gray scale data for selecting the gray scale voltage to execute the processing of step S7 is repeated until m=8 (step S12 to step S14).

When m=9, the V0 to V7 relay switches $32_k$ are switched in accordance with the diagram of FIG. 5. That is, the V1 relay switch $32_2$ is turned off (step S15), and the V2 relay switch $32_3$ is turned on (step S16) to supply the DC voltage V2 to the gray scale voltage generating unit 12. Then, the gray scale voltages V9 to V23 are measured (step S17 to step S20). The V0 to V7 relay switches $32_k$ are appropriately turned on/off based on the gray scale voltage $V_m$ in accordance with the diagram of FIG. 5 to execute the test on up to the gray scale voltage $V_{63}$ (to step S42). After that, the failure/no-failure test is executed based on the measurement result of all gray scale voltages $V_m$ (step S43) Finally, the device power source is turned off, the DC power source relay switches $32_k$ are turned off, and the DC relay switches 33*a* and 33*b* of the DC test unit are turned off to complete the test. Incidentally, the other tests may be executed on the circuits accepted in step S43.

Next, the processing of step S7 is described in detail. In this example, the case where the number of output terminals K of the driver of this embodiment is A is described. First, the initialization is executed by setting a count value k of a counter to 0 (step S51), and the following measurement is performed on all output terminals (step S52). That is, first, the DC relay switches 33*a* and 33*b* of the measurement circuit 30C connected with the output $OUT_k$ are turned on to set the VSIM mode (step S53). Then, a current value of the output $OUT_k$ is measured (step S54). If this current value is larger than a prescribed value (step S55: YES), the DC relay switches 33*a* and 33*b* of the measurement circuit 30C connected with the output $OUT_k$ are turned off (step S56) to increment k (step S57). It is determined whether or not the current value of each output $OUT_k$ is larger than the prescribed value until k reaches the number of output terminals A. On the other hand, in step S55, if the measurement current value is smaller than the prescribed value, that is, the ON resistance of the gray scale voltage selection circuit 11 is large, the circuit is rejected (step S58). The power sources and switches are turned off to complete the test (step S59). Further, when k reaches the number of output terminals A, the processing (SUB1 processing) is completed and the process advances the next step (step S8, S14, S20, S26, S32, S38, S38, or S43).

In this embodiment, the test switch 20 is provided to the output of the gray scale voltage selection circuit 11 of the D/A converter 6, and the output voltage of the gray scale voltage selection circuit 11 is directly measured. Hence, an ON resistance of the gray scale voltage selection circuit 11 can be accurately measured with no influence of the output amplifier unit 7. Further, as for various tests executed in the previous stage of the output amplifier unit 7, the output voltage of the D/A converter 6 can be similarly directly measured only by turning on the test switch 20. Further, the test switch 20 may be turned on in the test mode, and a general-purpose test circuit can be obtained with a very simple structure and simple control.

Incidentally, the present invention is not limited to the above embodiment, and allows various modifications within the scope of the present invention. For example, in FIG. 4, the output current of the gray scale voltage selection circuit 11 is measured, but the voltage may be measured. Further, a power source voltage is supplied to the gray scale voltage selection circuit 11 by way of the test switch 20, but a current may be measured using the measurement circuit 30B connected with the gray scale voltage generating unit 12. In addition, this embodiment describes the speed test for detecting an abnormality of the ON resistance of the gray scale voltage selection circuit. However, it is possible to perform other functional tests such as a test of leakage between output pins using an LSI tester. In this case, during the test, a test signal may be kept active on the driver side, so unlike the above related art, the on/off control of the switches is unnecessary, making it possible to shorten the test period.

It is apparent that the present invention is not limited to the above embodiment that may be modified and changed without departing from the scope and spirit of the invention.

What is claimed is:

1. A method of testing a driving circuit for a display device, comprising:

supplying a test signal to a test switch provided between a D/A converter and amplifier to set a test mode, the D/A converter selecting and outputting a gray scale voltage of the driving circuit, and the amplifier amplifying an output voltage of the D/A converter; and connecting the D/A converter with an output terminal of the driving circuit through the test switch to conduct a test on the D/A converter, wherein a non zero-first voltage is applied to the output terminal through the test switch, and a second voltage is applied to an input terminal of the D/A converter to supply a current to a path selectively provided in the D/A converter to measure a resistance value of the D/A converter.

2. The method of testing a driving circuit according to claim 1, wherein the D/A converter selects and outputs a predetermined gray scale voltage to measure the output voltage at the output terminal.

3. A method of testing a driving circuit for display device, comprising, supplying a test signal to a test switch provided between a D/A converter and amplifier to set a test mode, the D/A converter selecting and outputting a gray scale voltage of the driving circuit, and the amplifier amplifying an output voltage of the D/A converter; and connecting the D/A converter with an output terminal of the driving circuit through the test switch, bypassing the amplifier, to conduct a test on the D/A converter, wherein a gray scale voltage generating unit of the D/A converter generates a plurality of gray scale voltages by use of a first measuring device for supplying a voltage for generating a gray scale voltage, a gray scale voltage selecting unit of the D/A converter selects a predetermined gray scale voltage from the plurality of gray scale voltages generated with the gray scale voltage selecting unit of the D/A converter to output the selected gray scale voltage by use of a second measuring device for selecting and outputting the predetermined gray scale voltage, and the gray scale voltage selecting unit is tested for an operation based on the gray scale voltage selected and output with the gray scale voltage selecting unit by use of a third measuring device connected with the output terminal.

4. A driving circuit for a display device that selects and outputs a gray scale voltage in accordance with a supplied image signal to amplify and output the gray scale voltage, comprising:

a D/A converter which selects and outputs the gray scale voltage;

an amplifier which amplifies an output voltage of the D/A converter; and a test switch which connects the D/A converter with an output terminal of the amplifier, wherein the test switch disconnects the amplifier from the D/A converter when receiving a test signal in a test mode and enables measurement of an output voltage of the D/A converter directly through the test switch and the output terminal wherein a non zero first voltage is applied to the output terminal through the test switch, and a second voltage is applied to an input terminal of the D/A converter to supply a current to a path selectively provided in the D/A converter switch to measure a resistance value of the D/A converter.

5. The driving circuit for a display device according to claim 4, wherein the D/A converter includes a gray scale voltage generating unit for generating a plurality of gray scale voltages based on a voltage supplied from a voltage source, and a gray scale voltage selecting unit for selecting a predetermined gray scale voltage from the plurality of gray scale voltages generated with the gray scale voltage generating unit to output the selected gray scale voltage, and the test switch connects the gray scale voltage selecting unit with the output terminal.

* * * * *

UNITED STATES PATENT AND TRADEMARK OFFICE

CERTIFICATE OF CORRECTION

PATENT NO. : 7,859,268 B2
APPLICATION NO. : 11/512351
DATED : December 28, 2010
INVENTOR(S) : Noboru Okuzono et al.

It is certified that error appears in the above-identified patent and that said Letters Patent is hereby corrected as shown below:

In the Specification

Column 6, Lines 10-33: Delete "The D/A converter 6 includes the gray scale voltage selection circuit 11 and the gray scale voltage generating unit 12. In this embodiment, a gray scale voltage of 64 gray scales is generated and selectively output. In this case, for example, the gray scale voltage generating unit 12 includes 63 resistors R0 to R62. The gray scale voltage of 64 gray scales is generated to divide a DC power supplied by the measurement circuit 30A through the resistive division. In this embodiment, 8 DC power sources $31_1$ to $31_8$($31_k$) for supplying the DC power (voltages V0 to V7) and relay switches $32_1$ to $32_8$ ($32_k$) for connecting the DC power sources $31_k$ with the gray scale voltage generating unit 12 are provided. A predetermined DC power (voltages V0 to V7) can be supplied to the gray scale voltage generating unit 12 by appropriately turning on/off the relay switches $32_k$. The gray scale voltage selection circuit 11 includes 64 terminals GMA0 to GMA63. Each end of resistors R0 to R62 of the gray scale voltage generating unit 12 is connected with the terminals GMA0 to GMA63 to select and output any one of gray scale voltages $V_0$ to $V_{63}$ ($V_n$) of 64 gray scales based on input data supplied from the level shifter 5. The output is connected with the measuring device 30C through the test switch 20 as described above to thereby measure the ON resistance of the transistors that compose the gray scale voltage selection circuit 11 of the D/A converter 6."

and insert -- The D/A converter or a method of testing the gray scale voltage selection circuit based on the above concept is described in more detail. FIG. 4 shows a tester for the driver of this embodiment. As shown in FIG. 4, the D/A converter 6 is connected with a measurement circuit (LSI tester) 30A. The measurement circuit 30A is a programmable DC power source. In this embodiment, 8 DC power sources $31_1$ to $31_8$ ($31_k$) are provided, and 8 DC voltages can be supplied.

LSI tester includes measurement circuits 30a, 30b, and 30c. The measurement circuit 30A is a programmable DC power source. The measurement circuit 30B is a pattern generator, which generates and applies start pulses and clocks supplied to the shift register 2, data supplied to the data register 3, data latch signals and polarity inversion signals supplied to the data latch. Further, the measurement circuit 30B generates a test signal to supply the test signal to the test switch 20. The measurement circuit 30C is a DC test unit, and includes DC relay switches 33a and 33b, a voltage source/current Signed and Sealed this
Second Day of September, 2014

Michelle K. Lee
*Deputy Director of the United States Patent and Trademark Office* measurement circuit (VSIM) 34, and a current source/voltage measurement circuit (ISVM) 35. The DC relay switch 33a is used to connect an output corresponding to a predetermined output terminal with the measurement circuit 30C. Further, the DC relay switch 33b switches the voltage source/current measurement circuit 34 and the current source/voltage measurement circuit 35. Thus, a voltage may be generated to measure a current or a current may be generated to measure a voltage in the measurement circuit 30C. --

Column 6, Lines 60-67: Delete "The D/A converter or a method of testing the gray scale voltage selection circuit based on the above concept is described in more detail. FIG. 4 shows a tester for the driver of this embodiment. As shown in FIG. 4, the D/A converter 6 is connected with a measurement circuit (LSI tester) 30A. The measurement circuit 30A is a programmable DC power source. In this embodiment, 8 DC power sources $31_1$ to $31_8$ ($31_k$) are provided, and 8 DC voltages can be supplied."

Column 7, Lines 1-19: Delete "LSI tester includes measurement circuits 30a, 30b, and 30c. The measurement circuit 30A is a programmable DC power source. The measurement circuit 30B is a pattern generator, which generates and applies start pulses and clocks supplied to the shift register 2, data supplied to the data register 3, data latch signals and polarity inversion signals supplied to the data latch. Further, the measurement circuit 30B generates a test signal to supply the test signal to the test switch 20. The measurement circuit 30C is a DC test unit, and includes DC relay switches 33a and 33b, a voltage source/current measurement circuit (VSIM) 34, and a current source/voltage measurement circuit (ISVM) 35. The DC relay switch 33a is used to connect an output corresponding to a predetermined output terminal with the measurement circuit 30C. Further, the DC relay switch 33b switches the voltage source/current measurement circuit 34 and the current source/voltage measurement circuit 35. Thus, a voltage may be generated to measure a current or a current may be generated to measure a voltage in the measurement circuit 30C."

and insert -- The D/A converter 6 includes the gray scale voltage selection circuit 11 and the gray scale voltage generating unit 12. In this embodiment, a gray scale voltage of 64 gray scales is generated and selectively output. In this case, for example, the gray scale voltage generating unit 12 includes 63 resistors R0 to R62. The gray scale voltage of 64 gray scales is generated to divide a DC power supplied by the measurement circuit 30A through the resistive division. In this embodiment, 8 DC power sources $31_1$ to $31_8$($31_k$) for supplying the DC power (voltages V0 to V7) and relay switches $32_1$ to $32_8$ ($32_k$) for connecting the DC power sources $31_k$ with the gray scale voltage generating unit 12 are provided. A predetermined DC power (voltages V0 to V7) can be supplied to the gray scale voltage generating unit 12 by appropriately turning on/off the relay switches $32_k$. The gray scale voltage selection circuit 11 includes 64 terminals GMA0 to GMA63. Each end of resistors R0 to R62 of the gray scale voltage generating unit 12 is connected with the terminals GMA0 to GMA63 to select and output any one of gray scale voltages $V_0$ to $V_{63}$ ($V_n$) of 64 gray scales based on input data supplied from the level shifter 5. The output is connected with the measuring device 30C through the test switch 20 as described above to thereby measure the ON resistance of the transistors that compose the gray scale voltage selection circuit 11 of the D/A converter 6. --